(12) United States Patent
Kitahata

(10) Patent No.: US 6,475,398 B2
(45) Date of Patent: Nov. 5, 2002

(54) SEMICONDUCTOR DEVICE INCORPORATING HEMISPHERICAL SOLID IMMERSION LENS, APPARATUS AND METHOD FOR MANUFACTURING SAME

(75) Inventor: Hideki Kitahata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/962,430

(22) Filed: Sep. 25, 2001

(65) Prior Publication Data

US 2002/0043707 A1 Apr. 18, 2002

(30) Foreign Application Priority Data

Oct. 10, 2000 (JP) .......................................... 2000-308890
Apr. 16, 2001 (JP) .......................................... 2001-116647

(51) Int. Cl.[7] .............................. H01L 21/00; B44C 1/22
(52) U.S. Cl. ................................ 216/2; 216/26; 216/33; 216/41; 216/52; 216/88; 216/100; 438/691; 438/745

(58) Field of Search ................................. 216/2, 24, 26, 216/33, 41, 52, 88, 100; 438/690, 691, 692, 745, 753

(56) References Cited

U.S. PATENT DOCUMENTS 4,279,690 A * 7/1981 Dierschke ................. 216/24 X

FOREIGN PATENT DOCUMENTS

| JP | 05-157701 | 6/1993 |
| JP | 2000-121930 | 4/2000 |

OTHER PUBLICATIONS

S.M. Mansfield et al., "Solid Immersion Microscope", Appl. Phys. Lett. 57 (24), pp. 2615–2616, Dec. 10, 1990.

* cited by examiner

Primary Examiner—William A. Powell
(74) Attorney, Agent, or Firm—Scully, Scott, Murphy & Presser

(57) ABSTRACT

In a semiconductor device having a front surface where circuits are formed and a back surface, a hemishperical solid immersion lens is formed at the back surface of the semiconductor device in a body with the semiconductor device.

8 Claims, 16 Drawing Sheets

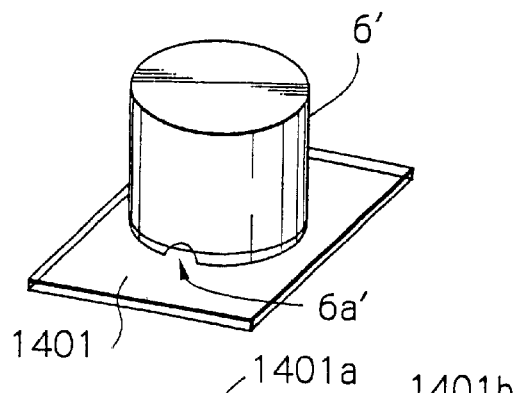
Fig. 14A
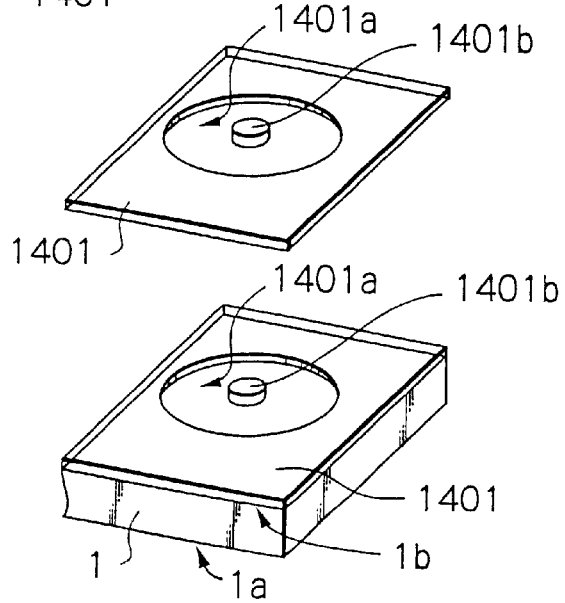
Fig. 14B
Fig. 14C
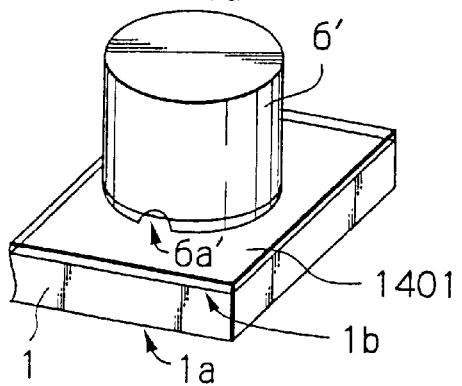
Fig. 14D
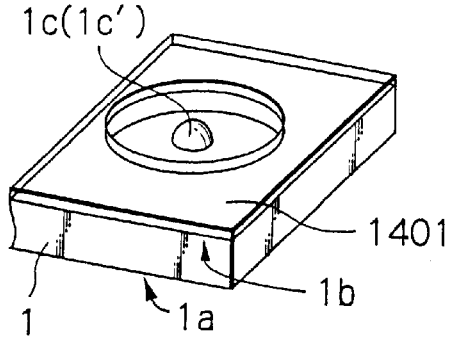
Fig. 14E

SEMICONDUCTOR DEVICE INCORPORATING HEMISPHERICAL SOLID IMMERSION LENS, APPARATUS AND METHOD FOR MANUFACTURING SAME

BACKGROUND OF THE INVENTION

1. Field of the Invention

The present invention relates to a semiconductor device evaluating system, and more particularly, a semiconductor device, and an apparatus and a method for manufacturing the same.

2. Description of the Related Art

Generally, as a semiconductor device has been highly integrated, it has been impossible to detect a fault in interconnect layers and circuit elements formed in a front surface of the semiconductor device. In order to effectively detect such a fault, an evaluation method such as an emission microscope (EMS) method or an optical beam induced current (OBIC) method has been developed. According to this evaluating method, infrared rays generated from the front surface penetrate the semiconductor device, so that the infrared rays can be observed from the back surface of the semiconductor device.

In a first prior art semiconductor device evaluating apparatus, if infrared rays are used for evaluating the circuits of the front surface of a semiconductor device, infrared rays are irradiated from an objective lens onto the semiconductor device, and the location of the objective lens is adjusted, so that the focal point of the infrared rays is brought close to the front surface of the semiconductor device. In this case, the wavelength of infrared rays in the semiconductor device is shorter than that in the air by the refractive index of the semiconductor device. As a result, a higher resolution can be expected by the shorter wavelength of the infrared rays in the semiconductor device. This will be explained later in detail.

In the first prior art semiconductor device evaluating apparatus, however, since the infrared rays are refracted at the back surface, the effective numerical aperture is decreased by the refractive index of the semiconductor device. As a result, the resolution increased by the shorter wavelength length is offset by the resolution decreased by the decreased numerical aperture, so that the resolution cannot be increased. In addition, since the semiconductor device is inserted into the optic axis, the aberration is increased. After all, a higher resolution cannot be realized.

In a second prior art semiconductor device evaluating apparatus (see: JP-A-5-157701), a planoconvex lens made of the same material as a semiconductor device is in direct contact with the back surface of the semiconductor device. Therefore, the combination of the planoconvex lens and a part of the semiconductor device serve as a solid immersion lens (SIL). This also will be explained later in detail.

In the second prior art semiconductor device evaluating apparatus, the infrared rays are not refracted at the convex surface of the planoconvex lens, and accordingly, the effective numerical aperture is not decreased. As a result, a higher resolution can be expected by the shorter wavelength of the infrared rays in the solid immersion lens.

In the second prior art semiconductor device evaluating apparatus, however, if a gap is generated between the planoconvex lens and the back surface of the semiconductor device, infrared rays having an incident angle larger than the critical angle are totally reflected, so that such infrared rays cannot pass through the semiconductor device. Therefore, the effective numerical aperture is limited by the critical angle.

Thus, in the second prior art semiconductor device evaluating apparatus, a higher resolution cannot be realized.

In a third prior art semiconductor device evaluating apparatus (see: S. M. Mansfield et al., "Solid Immersion Microscope", Appl. Phys. Lett. 57(24), pp. 2615–2616, Dec. 10, 1990), a conical solid immersion lens is provided. This also will be explained later in detail.

In the third prior art semiconductor device evaluating apparatus, however, when evaluating the circuits of the front surface of the semiconductor device, the flat spot of the conical solid immersion lens has to be increased, and accordingly, the radius of the convex face of the conical solid immersion lens also has to be increased. Thus, the direct contact of the conical solid immersion lens may be deteriorated.

SUMMARY OF THE INVENTION

It is an object of the present invention to provide a semiconductor device suitable for a higher resolution evaluating method from the back surface thereof.

Another object is to provide an apparatus for manufacturing the above-mentioned semiconductor device.

Still another object is to provide a method for manufacturing the above-mentioned semiconductor device.

According to the present invention, in a semiconductor device having a front surface where circuits are formed and a back surface, a hemispherical solid immersion lens is formed at the back surface of the semiconductor device in a body with the semiconductor device.

BRIEF DESCRIPTION OF THE DRAWINGS

The present invention will be more clearly understood from the description set forth below, as compared with the prior art, with reference to the accompanying drawings, wherein:

FIGS. 14A, 14B, 14C, 14D and 14E are diagrams for explaining a second method for forming a circular guide used in the manufacturing apparatus of FIG. 10;

DESCRIPTION OF THE PREFERRED EMBODIMENTS

Before the description of the preferred embodiments, prior art semiconductor device evaluating apparatuses will be explained with reference to FIGS. 1 and 2.

Figure 1:
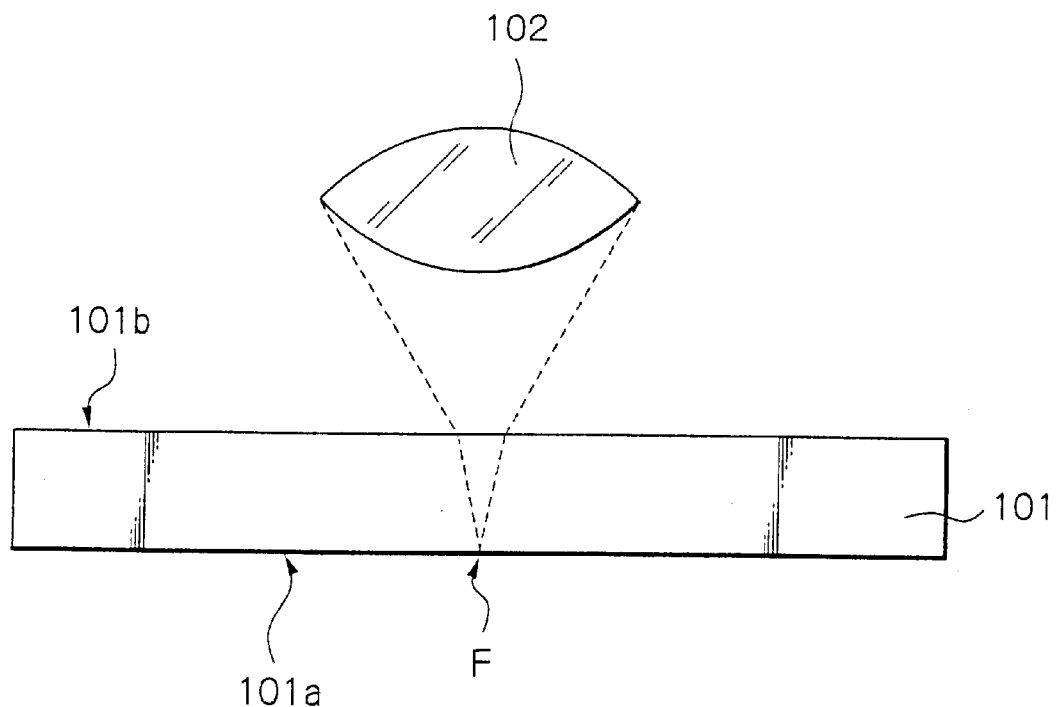
FIG. 1 is a cross-sectional view illustrating a first prior art semiconductor device evaluating apparatus.

In FIG. 1, which illustrates a first prior art semiconductor device evaluating apparatus, a semiconductor device (wafer) 101 has a front surface 101a on which various circuits (not shown) are formed and a back surface 101b. In this case, the back surface 101b of the semiconductor device 101 is mirror-finished. Then, in order to adjust the location of an objective lens 102, if infrared rays are used for evaluating the circuits of the front surface 101a, infrared rays are irradiated from the objective lens 102 onto the semiconductor device 101. Then, the location of the objective lens 102 is adjusted, so that the focal point F of the infrared rays is brought close to the front surface 101a of the semiconductor device 101. Then, the location of the objective lens 102 is fixed.

Note that the wavelength of infrared rays in the semiconductor device 101 is shorter than that in the air by the refractive index of the semiconductor device 101. If the semiconductor device 101 is made of silicon monocrystalline, the refractive index n thereof is 3.5. Therefore, the wavelength of infrared rays in the semiconductor device 101 is 0.3 μm (=1.1 μm/3.5) where the wavelength of infrared rays is 1.1 μm in the air. As a result, a higher resolution can be expected by the shorter wavelength of the infrared rays in the semiconductor device 101.

Next, the circuits of the front surface 101a of the semiconductor device 101 are evaluated by an evaluation method such as an EMS method or an OBIC method. That is, infrared rays are generated from the front surface 101a of the semiconductor device 101 and are transmitted via the semiconductor device 101 and the objective lens 102 to a charge coupled device (CCD) camera (not shown) or the like.

In the semiconductor device evaluating apparatus of FIG. 1, however, since the infrared rays are refracted at the back surface 101b, so that the infrared rays are focussed on the focal point F' which is deeper than a focal point in the air, the effective numerical aperture is decreased by the refractive index of the semiconductor device 101. As a result, the resolution increased by the shorter wavelength length is offset by the resolution decreased by the decreased numerical aperture, so that the resolution cannot be increased. In addition, since the semiconductor device 101 is inserted into the optic axis, the aberration is increased. After all, a higher resolution cannot be realized.

Figure 2:
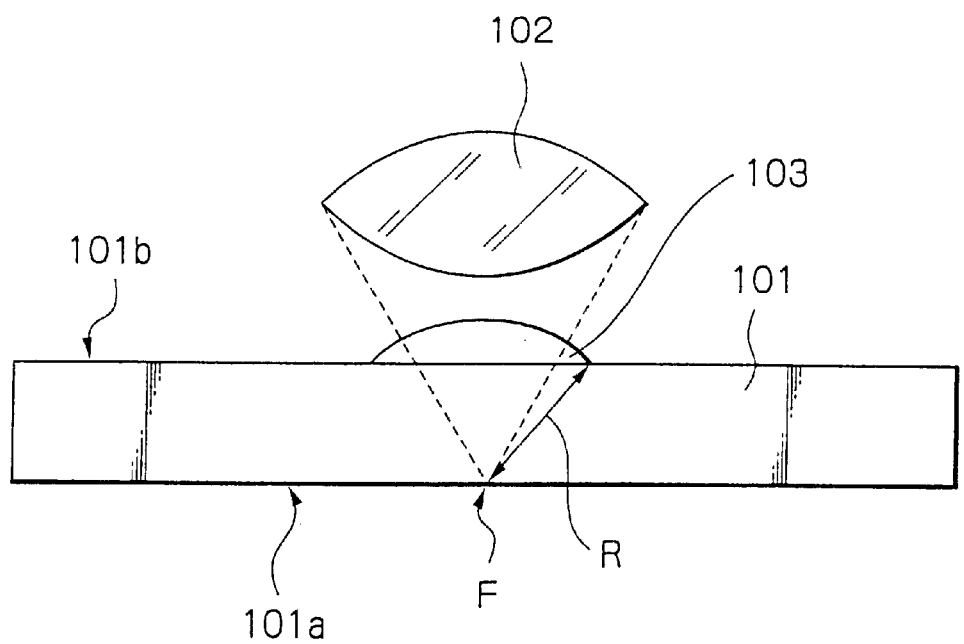
FIG. 2 is a cross-sectional view illustrating a second prior art semiconductor device evaluating apparatus.

In FIG. 2, which illustrates a second prior art semiconductor device evaluating apparatus (see: JP-A-5-157701), a planoconvex lens 103 made of the same material as the semiconductor device 101 is in direct contact with the back surface 101b of the semiconductor device 101. In this case, the planoconvex lens 103 has a convex surface opposing the objective 102 and a flat surface opposing the semiconductor device 101. Therefore, the combination of the planoconvex lens 103 and a part of the semiconductor device 101 serve as a solid immersion lens.

In the semiconductor device evaluating apparatus of FIG. 2, since the convex surface of the planoconvex lens 103 has a radius R of curvature centered at the focal point F located at the front surface 101a of the semiconductor device 101, the focal point F is substantially the same as a focal point in the air. Therefore, the infrared rays are not refracted at the convex surface 102b, and accordingly, the effective numerical aperture is not decreased. As a result, a higher resolution can be expected by the shorter wavelength of the infrared rays in the solid immersion lens.

In the semiconductor device evaluating apparatus of FIG. 2, however, if a gap is generated between the planoconvex lens 103 and the back surface 101b of the semiconductor device 101, infrared rays having an incident angle larger than the critical angle are totally reflected, so that such infrared rays cannot pass through the semiconductor device 101. Therefore, the effective numerical aperture is limited by the critical angle.

In addition, if the gap between the planoconvex lens 103 and the back surface 101b of the semiconductor device 101 is about the same as the wavelength of infrared rays, the infrared rays having an incident angle larger than the critical angle can propagate by using its near-electric field mode. That is, the amplitude E of the near-electric field is represented by $$E \propto \exp(-2\pi z/\lambda(n^2\sin^2\theta - 1)^{1/2})$$

z is the distance from the back surface 101b of the semiconductor device 101;

λ is the wavelength of infrared rays in the air;

n is the refractive index of the semiconductor device 101; and

θ is the incident angle of the infrared rays.

Therefore, as the distance z increases, the amplitude E rapidly decreases. For example, if n=3.5, θ=60°, λ=1.1μm and z=140 nm, the amplitude E is decreased by about 1/10. This means that infrared rays having a larger incident angle to contribute to the resolution hardly pass through the gap.

Therefore, even in the semiconductor device evaluating apparatus of FIG. 2 where the gap between the back surface 101b of the semiconductor device 101 and the planoconvex lens 103 is relatively small, since the near-electric field E for infrared rays having a larger incident angle to contribute to the resolution is very small, the infrared rays hardly pass through the gap.

Thus, in the semiconductor device evaluating apparatus of FIG. 2 a higher resolution cannot be realized.

Figure 3:
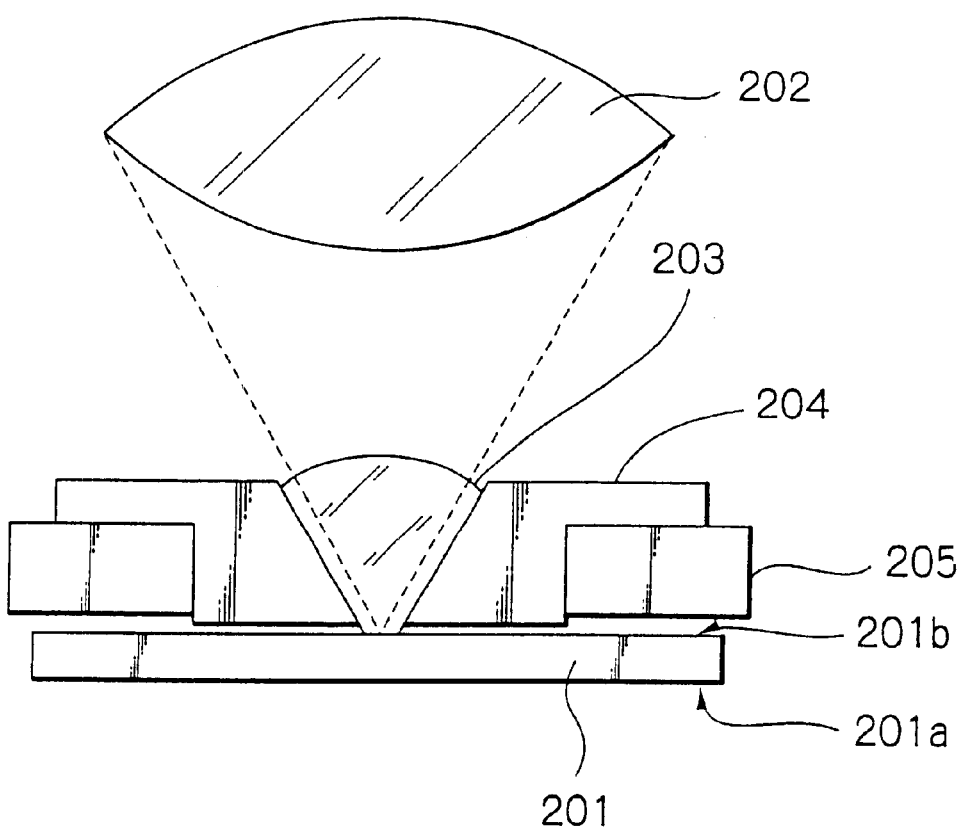
FIG. 3 is a cross-sectional view illustrating a third prior art semiconductor device evaluating apparatus.

In FIG. 3 which illustrates a third prior art semiconductor device evaluating apparatus (see: S. M. Mansfield et al., "Solid Immersion Microscope", Appl. Phys. Lett. 57(24), pp. 2615–2616, Dec. 10, 1990), a semiconductor device (wafer) 201 has a front surface 201a and a back surface 201b. In order to evaluate the back surface 201b of the semiconductor device 201, infrared rays are irradiated from an objective lens 202 via a conical solid immersion lens 203 onto the semiconductor device 201. Therefore, the location of the objective lens 202 is adjusted, so that the focus point F is brought close to the back surface 201b of the semiconductor device 201. Then, the location of the objective lens 202 is fixed.

In the semiconductor device evaluating apparatus of FIG. 3, the conical solid immersion lens 203 is surrounded by an inner ring 204 and an outer ring 205. Since the conical solid immersion lens 203 has a small-diameter flat spot, the conical solid immersion lens 203 is effectively in direct contact with the back surface 201b of the semiconductor device 201. Note that the semiconductor device evaluating apparatus of FIG. 3 is suitable for evaluating the back surface 201b of the semiconductor device 201, not the front surface 201a of the semiconductor device 201.

In the semiconductor device evaluating apparatus of FIG. 3, however, when evaluating the circuits of the front surface 201a of the semiconductor device 201, the flat spot of the conical solid immersion lens 203 has to be increased, and accordingly, the radius of the convex face of the conical solid immersion lens 203 also has to be increased. Thus, the direct contact of the conical solid immersion lens 203 may be deteriorated.

Figure 4:
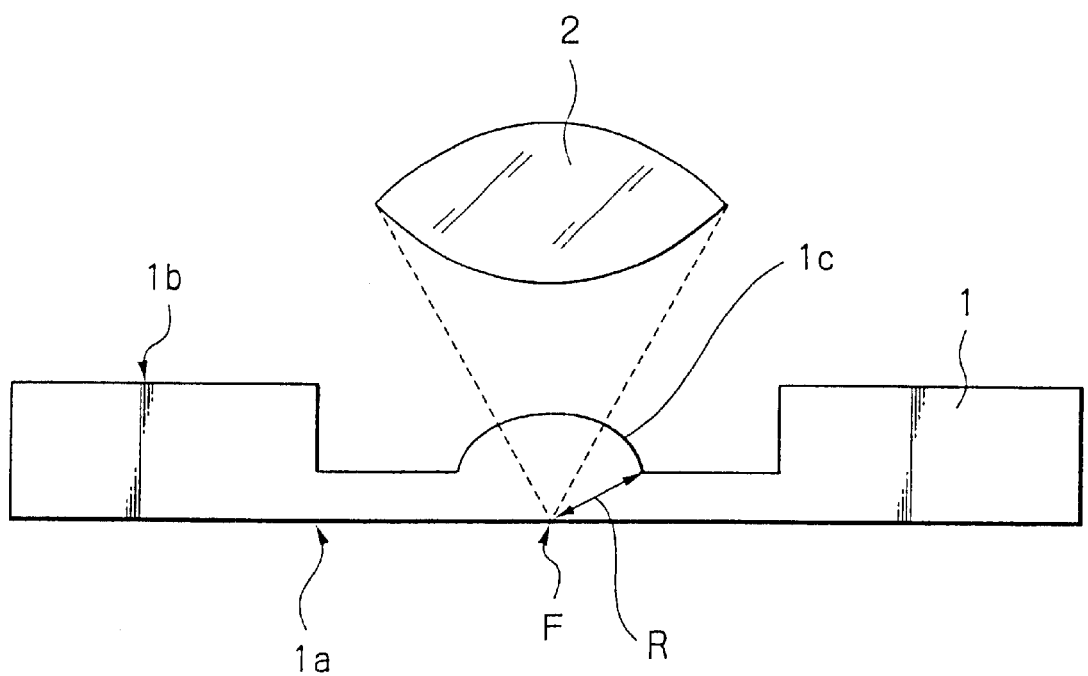
FIG. 4 is a cross-sectional view illustrating a first embodiment of the semiconductor device evaluating apparatus according to the present invention.

In FIG. 4, which illustrates a first embodiment of the semiconductor device evaluating apparatus according to the present invention, a semiconductor device 1 has a front surface 1a where various circuits (not shown) are formed and a back surface 1b. Also, a hemispherical solid immersion lens 1c is formed in a body with the semiconductor device 1 on the back surface 1b thereof. In this case, the radius R of curvature of the semispherical solid immersion lens 1c is centered at the front surface 1a of the semiconductor device 1. Therefore, the hemispherical solid immersion lens 1c is a part of a perfect hemisphere. Also, reference numeral 2 designates an objective lens.

In order to adjust the location of the objective lens 2, if infrared rays are used for evaluating the circuits of the front surface 1a of the semiconductor device 1, infrared rays are irradiated from the objective lens 2 via the hemispherical solid immersion lens 1c onto the front surface 1a. Then, the location of the objective lens 2 is adjusted, so that the focal point F of the infrared rays is brought close to the front surface 1a of the semiconductor device 1. Then, the location of the objective lens 1 is fixed. In this case, since the infrared rays are not refracted at the spherical surface of the hemispherical solid immersion lens 1c, the effective numerical aperture is not decreased. In addition, there is no gap between the semiconductor device 1 and the hemispherical solid immersion lens 1c, the effective numerical aperture is not limited by the critical angle.

Next, the circuits of the front surface 1a of the semiconductor device 1 are evaluated by an EMS method or an OBIC method. That is, infrared rays are generated from the front surface 1a of the semiconductor device 1 and are transmitted via the semiconductor device 1, the hemispherical solid immersion lens 1c and the objective lens 2 to a CCD camera (not shown) or the like.

In FIG. 4, since the focal point F is about the same as a focal point in the air so that the infrared rays are not refracted at the peripheral surface of the hemispherical solid immersion lens 1c, the effective numerical aperture is not decreased. In this case, a higher resolution can be expected by the shorter wavelength of the infrared rays in the hemispherical solid immersion lens 1c and the semiconductor device 1. For example, if the semiconductor device 1 and the spherical solid immersion lens 1c are made of silicon monocrystalline, the refractive index n is 3.5, so that the resolution can be increased by 3.5.

Also, in FIG. 4, since the infrared rays are not refracted at the peripheral surface of the hemispherical solid immersion lens 1c and are also converged to the focal point F, the aberration is not increased, so that the resolution is not decreased by the blurring of the focal point F.

Further, in FIG. 4, since there is no gap between the hemispherical solid immersion lens 1c and the semiconductor device 1, the resolution is not decreased by a gap generated in the semiconductor device evaluating apparatus of FIG. 2.

Thus, a higher resolution can be surely obtained by the hemispherical solid immersion lens 1c. For example, the resolution of the semiconductor device evaluating apparatus of FIG. 4 is 3.5 times that of the semiconductor device evaluating apparatus of FIG. 1 where the refractive index n of the semiconductor device 1 (the hemispherical solid immersion lens 1c) is 3.5.

Figure 5:
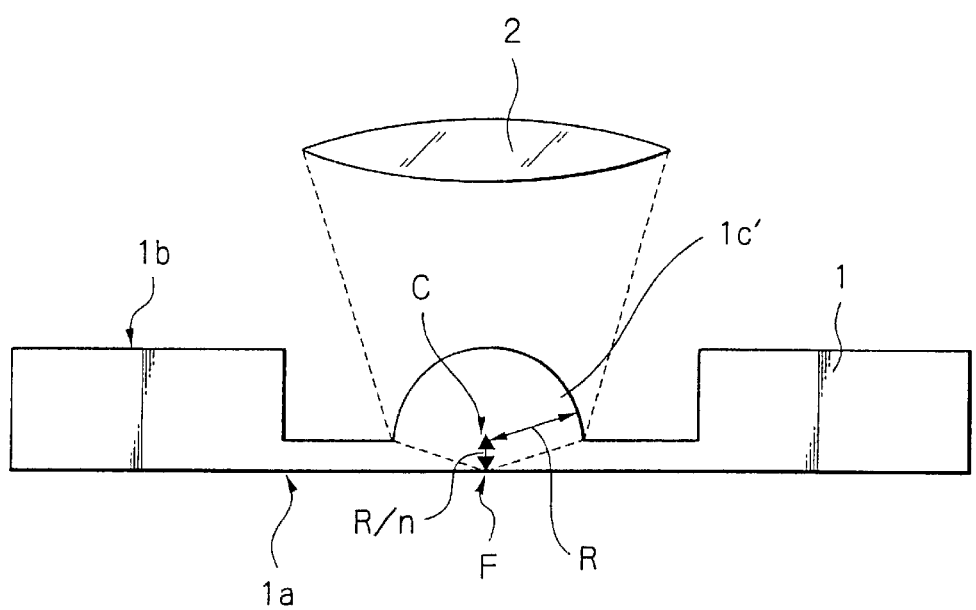
FIG. 5 is a cross-sectional view illustrating a second embodiment of the semiconductor device evaluating apparatus according to the present invention.

In FIG. 5, which illustrates a second embodiment of the semiconductor device evaluating apparatus according to the present invention, a hemispherical solid immersion lens 1c' has a radius R of curvature centered at a point C above the front surface 1a of the semiconductor device 1. In this case, a distance between the point C and the front surface 1a of the semiconductor device 1 is R/n where n is the refractive index of the semiconductor device 1 (the hemispherical solid immersion lens 1c').

Note that the hemispherical solid immersion lens 1c' is preferably a perfect hemisphere.

In FIG. 5, infrared rays from the objective lens 2 are refracted at the spherical surface of the hemispherical solid immersion lens 1c'; however, the infrared rays are converged to a focal point F at the front surface 1a of the semiconductor device 1 below the center C. As a result, the effective numerical aperture is increased as compared with the semiconductor evaluating apparatus of FIG. 4. For example, the effective numerical aperture of the semiconductor device evaluating apparatus of FIG. 5 is increased by at most 3.5 compared with that of the semiconductor evaluating apparatus of FIG. 4 where the refractive index n of the semiconductor device 1 (the hemispherical solid immersion lens) is 3.5. Therefore, the resolution of the semiconductor device evaluating apparatus of FIG. 5 can be 12.3 (=3.5×3.5) times that of the semiconductor device evaluating apparatus of FIG. 1.

On the other hand, in FIG. 5, since the infrared rays are refracted at the spherical surface of the hemispherical solid immersion lens 1c', the aberration is increased as compared with the semiconductor device evaluating apparatus of FIG. 4, which may decrease the resolution. However, the resolution increased by the increased effective numerical aperture prevails over the resolution decreased by the increased aberration, so that a higher resolution can be obtained as compared with the semiconductor device evaluating apparatus of FIG. 4.

The hemispherical solid immersion lens 1c' is called a super hemispherical solid immersion lens or a Weierstrass-type spherical solid immersion lens, which is individually disclosed in FIG. 2 of JP-A-2000-121930.

A method for manufacturing the hemispherical solid immersion lens 1c (1c') of FIG. 4(FIG. 5) will be explained next with reference to FIGS. 6A, 6B and 6C.

Figure 6A:
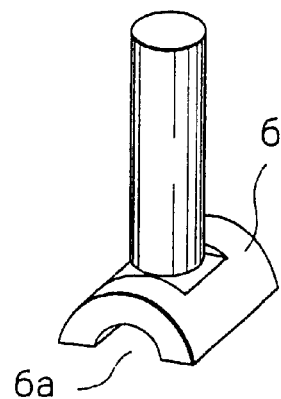
FIGS. 6A, 6B and 6C are perspective views for explaining a method for manufacturing the hemispherical solid immersion lens of FIGS. 4 and 5.

First, referring to FIG. 6A, a grinding tool 6 having a hemicircularly-cross-sectional groove 6a perpendicular to the rotation axis thereof is prepared. In this case, the groove 6a has a part of a hemicircular cross-section for the hemispherical solid immersion lens 1c of FIG. 4, while the groove 6a has a complete hemicircular cross-section for the hemispherical solid immersion lens 1c' of FIG. 5.

Figure 6B:
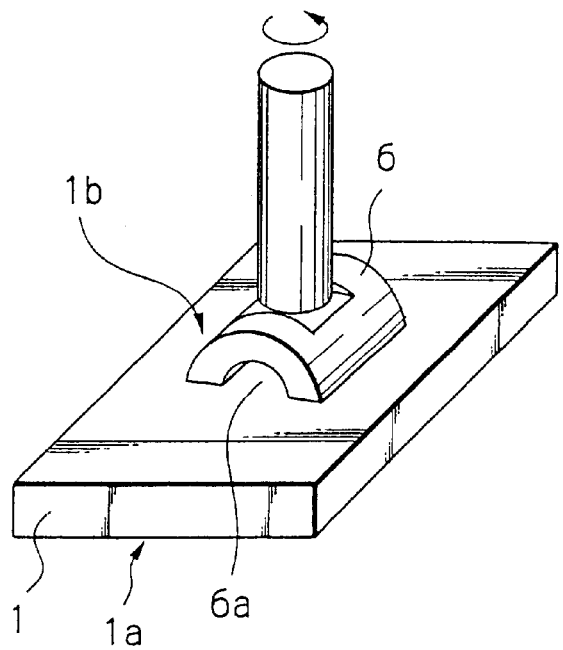

Next, referring to FIG. 6B, the tool 6 is placed onto the back surface 1b of a semiconductor device 1. Then, the tool 6 is rotated as indicated by an arrow, while abrasive such as diamond slurry or diamond paste is supplied thereto.

Figure 6C:
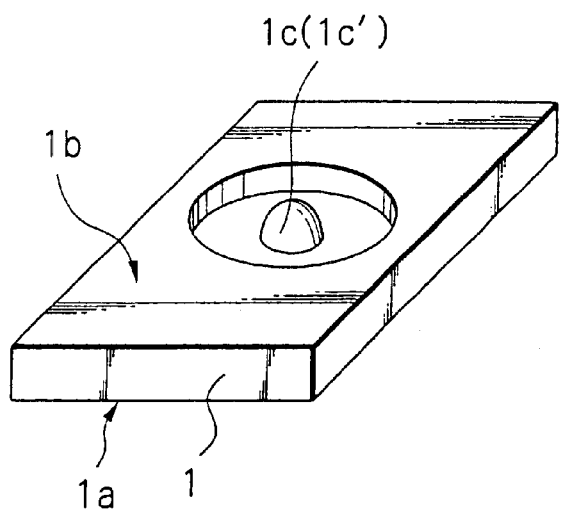

Finally, referring to FIG. 6C, the tool 6 is removed, and then a hemispherical solid immersion lens 1c or 1c' is formed on the back surface 1b of the semiconductor device 1. Then, the spherical surface of the hemispherical solid immersion lens 1c or 1c' is mirror-polished, and is coated by an anti-reflection layer (not shown), as occasion demands.

Figure 7A:
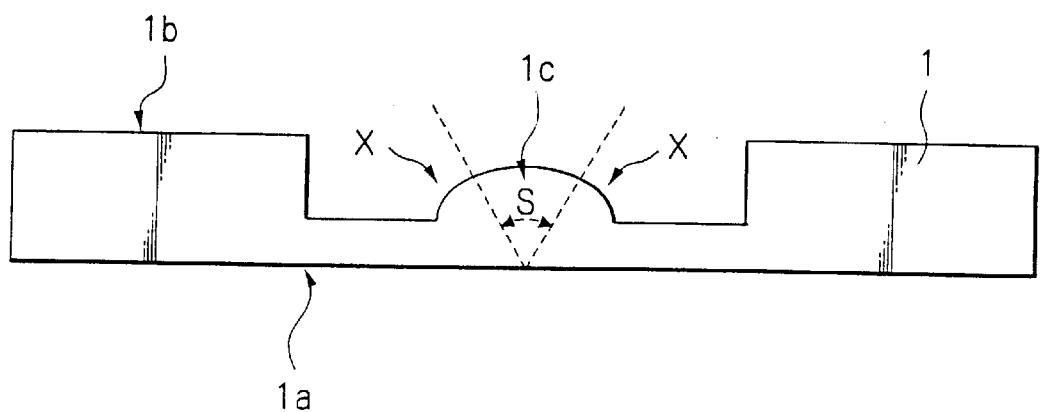
FIGS. 7A and 7B are cross-sectional views for explaining the thickness of the semiconductor device of FIG. 4.
Figure 7B:
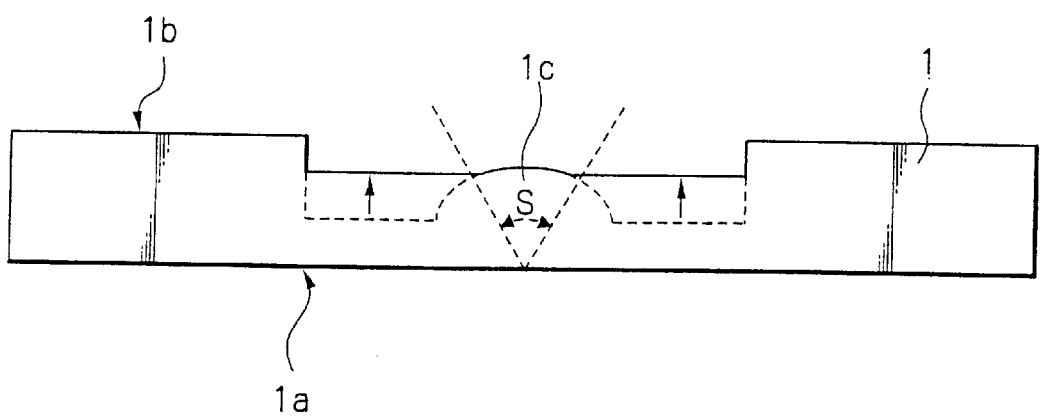

When manufacturing the hemispherical solid immersion lens 1c of FIG. 4, as illustrated in FIG. 7A, an outer portion X of a solid angle S corresponding to the numerical aperture of the objective lens 2 hardly affects the resolution. Therefore, in order not to deteriorate the circuits of the front surface 1a of the semiconductor device 1, the semiconductor device 1 at the periphery of the hemispherical solid immersion lens 1c can be thicker as illustrated in FIG. 7B. In FIG. 7B, the hemispherical solid immersion lens 1c has a hemispherical surface corresponding to only the solid angle S between the center of curvature thereof and the objective lens 2.

In FIGS. 4 and 5, after the hemispherical solid immersion lenses 1c and 1c' are formed on the back surface 1b of the semiconductor device 1, it is impossible to move the hemispherical solid immersion lens 1c and 1c'. However, generally, in a semiconductor device evaluating apparatus, locations of the semiconductor device 1 to be evaluated are specified in advance.

The apparatuses for manufacturing the hemispherical solid immersion lens 1c (1c') of FIG. 4 (FIG. 5) will be explained next with reference to FIGS. 8 and 9.

Figure 8:
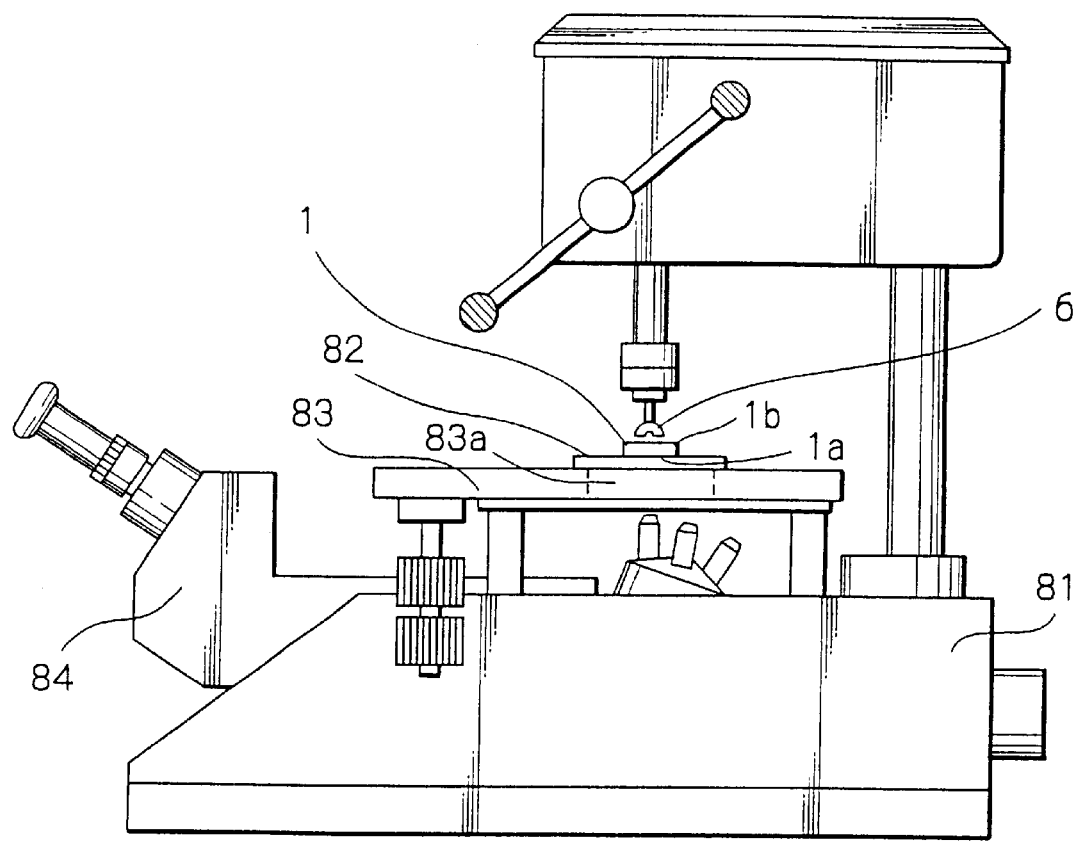
FIG. 8 is a diagram illustrating a first apparatus for manufacturing the hemispherical solid immersion lens of FIGS. 4 and 5.

In FIG. 8, which illustrates a first hemispherical solid immersion lens manufacturing apparatus, the grinding tool 6 of FIG. 6 capable of moving up and down is mounted on a pedestal 81. A front surface 1a of a semiconductor device 1 is fixed by transparent wax to a transparent plate 82 which is also fixed to a stage 83 fixed to the pedestal 81. In this case, the transparent plate 82 covers an opening 83a of the stage 83. Also, an inverted microscope 84 is provided to observe the front surface 1a of the semiconductor device 1 through the transparent plate 82.

In FIG. 8, the optical axis of the inverted microscope 84 is adjusted to conform to the rotation axis of the grinding tool 6.

The operation of the manufacturing apparatus of FIG. 8 is as follows. First, the stage 83 is moved, so that a specified layout pattern is detected by the inverted microscope 84 from the front surface 1a of the semiconductor device 1. Then, the stage 83 is fixed. Then, the grinding tool 6 is moved down and is rotated. As a result, a hemispherical solid immersion lens 1c or 1c' is formed at a portion of the back surface 1b of the semiconductor device 1 corresponding to the specified layout pattern of the front surface 1a thereof.

In the manufacturing apparatus of FIG. 8, a mark by a laser trimming method or the like can be provided at a location of the front or back surface corresponding to the above-specified layout pattern without deteriorating the circuits of the front surface 1a of the semiconductor device 1 in advance. In this case, the alignment of the stage 83 can be carried out by detecting such a mark by the inverted microscope 84 or visually.

Figure 9:
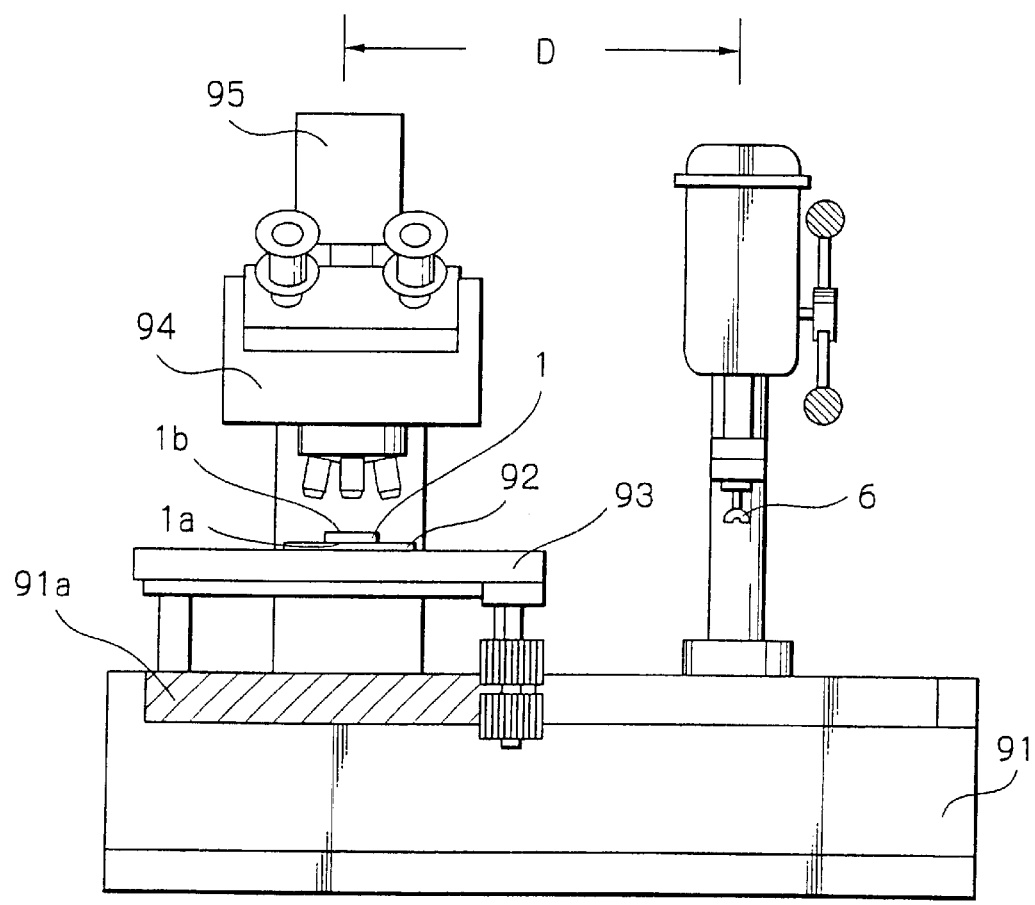
FIG. 9 is a diagram illustrating a second apparatus for manufacturing the hemispherical solid immersion lens of FIGS. 4 and 5.

In FIG. 9, which illustrates a second hemispherical solid immersion lens manufacturing apparatus, the grinding tool 6 of FIG. 6 capable of moving up and down is mounted on a pedestal 91. A front surface 1a of a semiconductor device 1 is fixed by wax to a plate 92 which is also fixed to a stage 93. The stage 93 is slidably mounted on the base stage 91. Also, a microscope 94 capable of observing using infrared rays and visible rays is provided to observe the back surface 1b of the semiconductor device 1. When the microscope 94 is operated by infrared rays, an infrared camera 95 is operated and is connected to a display unit (not shown).

The operation of the manufacturing apparatus of FIG. 9 is as follows. First, the stage 93 is moved, so that a specified layout pattern is detected by the microscope 94 using infrared rays from the front surface 1a of the semiconductor device 1. Then, the stage 93 is moved by a definite distance D using a slidable mechanism 91a. As a result, the rotation axis of the grinding tool 6 conforms to the location of the detected specified pattern. Then, the grinding tool 6 is moved down and is rotated. As a result, a hemispherical solid immersion lens 1c or 1c' is formed at a portion of the back surface 1b of the semiconductor device 1 corresponding to the specified layout pattern of the front surface 1a thereof.

Even in the manufacturing apparatus of FIG. 9, a mark by a laser trimming method or the like can be provided at a location of the front or back surface corresponding to the above-specified layout pattern without deteriorating the circuits of the front surface 1a of the semiconductor device 1 in advance. In this case, the alignment of the stage 93 can be carried out by detecting such a mark by the inverted microscope 94 or visually.

Figure 10:
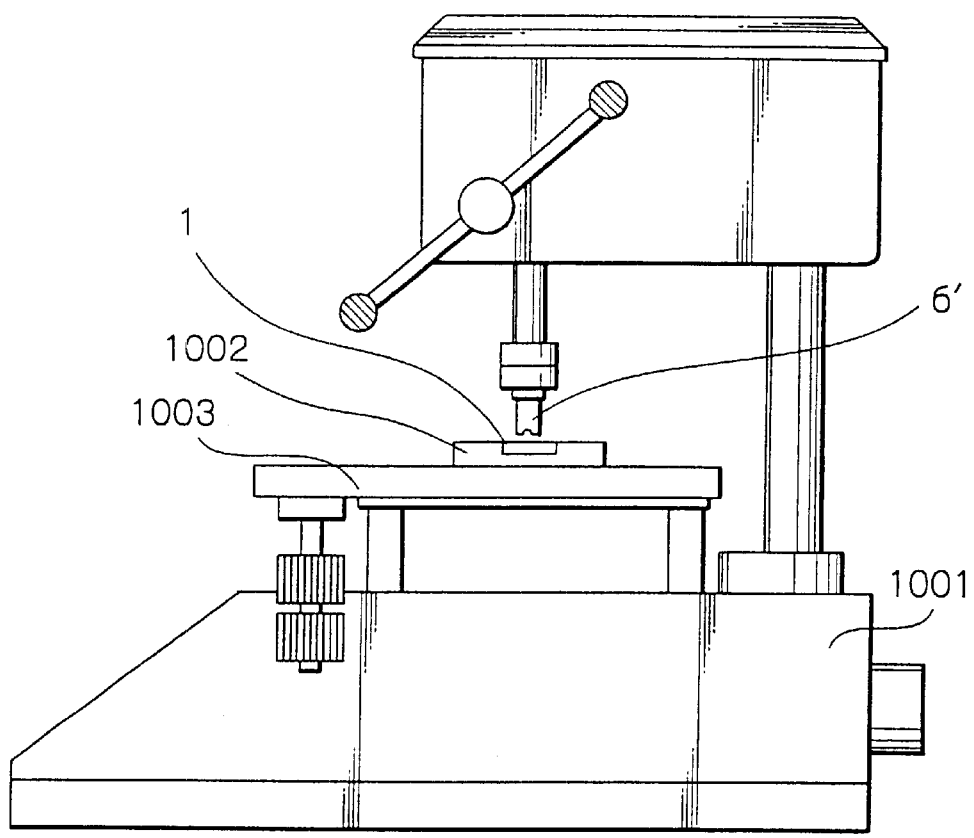
FIG. 10 is a diagram illustrating a third apparatus for manufacturing the hemispherical solid immersion lens of FIGS. 4 and 5.
Figure 11:
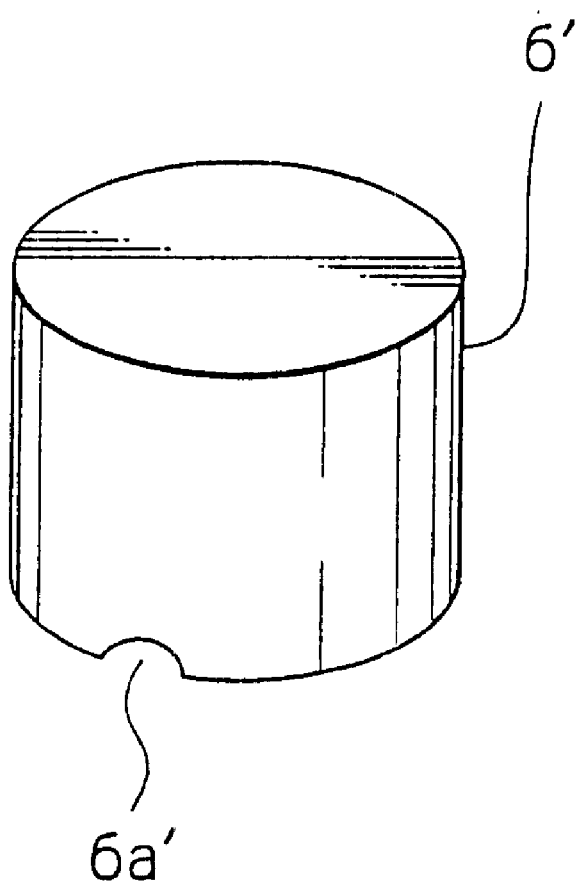
FIG. 11 is a perspective view of the grinding tool of FIG. 10.

In FIG. 10, which illustrates a third hemispherical solid immersion lens manufacturing apparatus, a grinding tool 6' capable of moving up and down is mounted on a pedestal 1001. A front surface 1a of a semiconductor device 1 is fixed by wax to an alignment unit 1002 which is also fixed to a stage 1003 fixed to the pedestal 1001. Note that the microscope 84 of FIG. 8 or the microscope 94 of FIG. 9 is not provided. As a result, the alignment of a semiconductor device 1 with respect to the grinding tool 6' is visually carried out. Note that the grinding tool 6' is entirely cylindrical, and has a hemicircular cross-sectional groove 6a' at the bottom thereof, as illustrated in FIG. 11. In this case, the length of the groove 6a' is the same as the diameter of the cylindrical grinding tool 6'.

Figure 12:
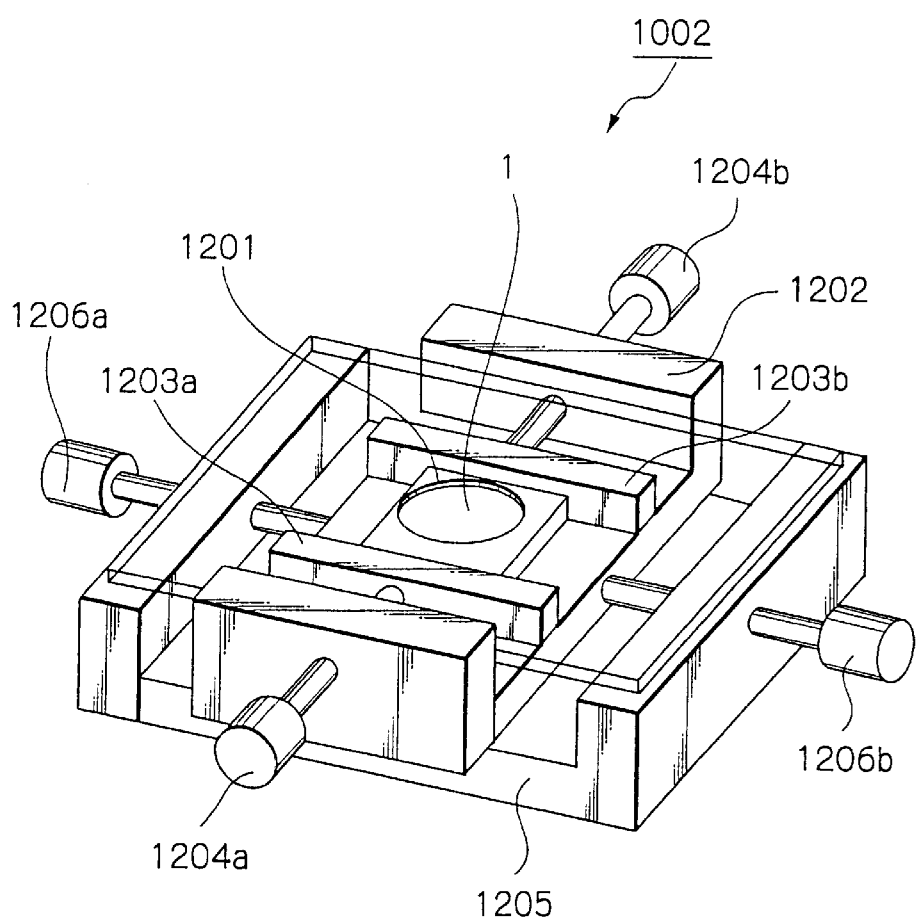
FIG. 12 is a perspective view of the alignment unit of FIG. 10.

In FIG. 12, which illustrates the alignment unit 1002 of FIG. 10, the alignment unit 1002 is used for aligning a specified location of the back surface 1b of the semiconductor device 1 to a circular guide 1201. Note that the circle of the circular guide 1201 corresponds to the circular cross section of the grinding tool 6'. The semiconductor device 1 is fixed to a sub stage 1202 by blocks 1203a and 1203b using screws 1204a and 1204b. Also, the sub stage 1202 is fixed to a stage 1205 by using screws 1206a and 1206b. That is, the location of the semiconductor device 1 can be accurately adjusted by the screws 1204a, 1204b, 1206a and 1206b with respect to the circular guide 1201. Thus, the stage 1003 to which the alignment unit 1002 is fixed is adjusted, a hemispherical solid immersion lens 1c or 1c' can be formed at the above-mentioned specific location of the back surface 1b of the semiconductor device 1.

In the apparatus of FIG. 10, a circular guide can be formed without using the alignment unit 1002. In this case, the alignment unit 1002 is replaced by a plate similar to the plate 82 of FIG. 8 or the plate 92 of FIG. 9, and the semiconductor device 1 having such a circular guide formed thereon is fixed by wax to the plate.

A first method for forming the above-mentioned circular guide will be explained next with reference to FIGS. 13A, 13B, 13C and 13D.

Figure 13A:
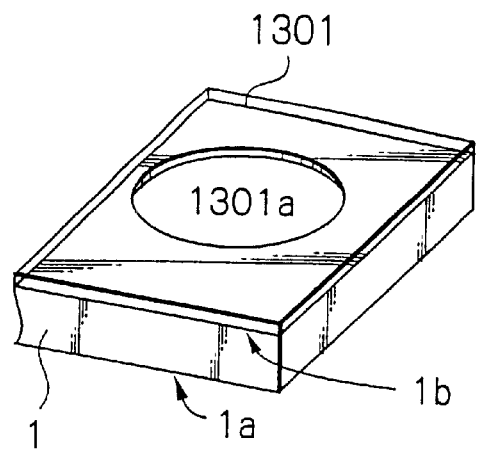
FIGS. 13A, 13B, 13C and 13D are diagrams for explaining a first method for forming a circular guide used in the manufacturing apparatus of FIG. 10.

First, referring to FIG. 13A, a photoresist pattern 1301 having a circular hole 1301a is formed on the back surface 1b of the semiconductor device 1 by using a double-side alignment exposure unit (not shown). In more detail, a photoresist layer is coated on the back surface 1b of the semiconductor device 1. Then, the front surface 1a of the semiconductor device 1 is placed on the double-side alignment exposure unit. Then, a photolithography process is carried out, so that the photoresist pattern 1301 having the circular hole 1301a is formed in correspondence to a special layout pattern formed on the front surface 1a of the semiconductor device 1.

Figure 13B:
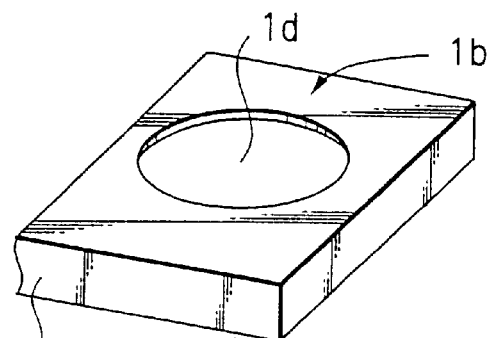

Next, referring to FIG. 13B, an isotropic etching process is carried out, so that a circular recess 1d is formed in the back surface 1b of the semiconductor device 1. Note that the edge of the circular recess 1d is sloped due to the isotropic etching process. Then, the photoresist pattern 1301 is removed. In this case, the circular recess 1d is a little larger than a circle formed by the rotation of the grinding tool 6'. Thus, the above-mentioned circular guide is formed in the semiconductor device 1 per se.

Figure 13C:
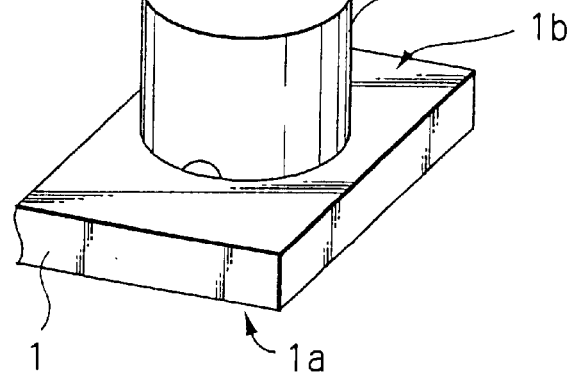

Next, referring to FIG. 13C, the semiconductor device 1 is fixed by wax to the plate (not shown) of FIG. 10 which is provided instead of the alignment unit 1002 of FIG. 10. Then, while the location of the plate is adjusted, the grinding tool 6' is moved down, so that the grinding tool 6' is visually fitted into the circular recess 1d of the semiconductor device 1. In this case, the grinding tool 6' can be smoothly fitted into the circular recess 1d of the semiconductor device 1 due to the sloped edge thereof. Then, the grinding tool 6' is rotated.

Figure 13D:
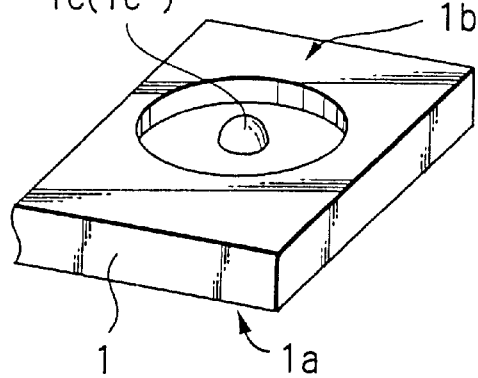

Finally, referring to FIG. 13D, after the grinding tool 6' is moved up, a hemispherical solid immersion lens 1c or 1c' is formed on the back surface 1b of the semiconductor device 1.

A second method for forming the above-mentioned circular guide will be explained next with reference to FIGS. 14A, 14B, 14C, 14D and 14E.

First, referring to FIG. 14A, a glass substrate 1401 is fixed to the plate (not shown) of FIG. 10. Then, the grinding tool 6' is moved down and then, is rotated. As a result, as illustrated in FIG. 14B, a circular recess 1401a is formed on the back surface of the glass substrate 1401. In this case, the circular recess 1401a does not penetrate the glass substrate 1401, so that an island 1401b is left in the center of the circular recess 1401a. However, the circular recess 1401a can completely penetrate the glass substrate 1401 without forming such an island. Thus, the above-mentioned circular guide is formed by the glass substrate 1401.

Next, referring to FIG. 14C, the glass substrate 1401 of FIG. 14B is departed from the plate (not shown) of FIG. 10 and is adhered by transparent thermosetting adhesives (not shown) to a specific location of the back surface 1b of the semiconductor device 1.

Next, referring to FIG. 14D, the semiconductor device 1 associated with the glass substrate 1401 is again fixed to the plate (not shown) of FIG. 10. Then, the grinding tool 6' is moved down, so that the grinding tool 6' is visually fitted into the circular recess 1401a of the glass substrate 1401. Then, the grinding tool 6' is rotated.

Finally, referring to FIG. 14E, after the grinding tool 6' is moved up, a hemispherical solid immersion lens 1c or 1c' is formed on the back surface 1b of the semiconductor device 1.

Actual semiconductor device evaluating apparatuses will be explained next with reference to FIGS. 15 and 16.

Figure 15:
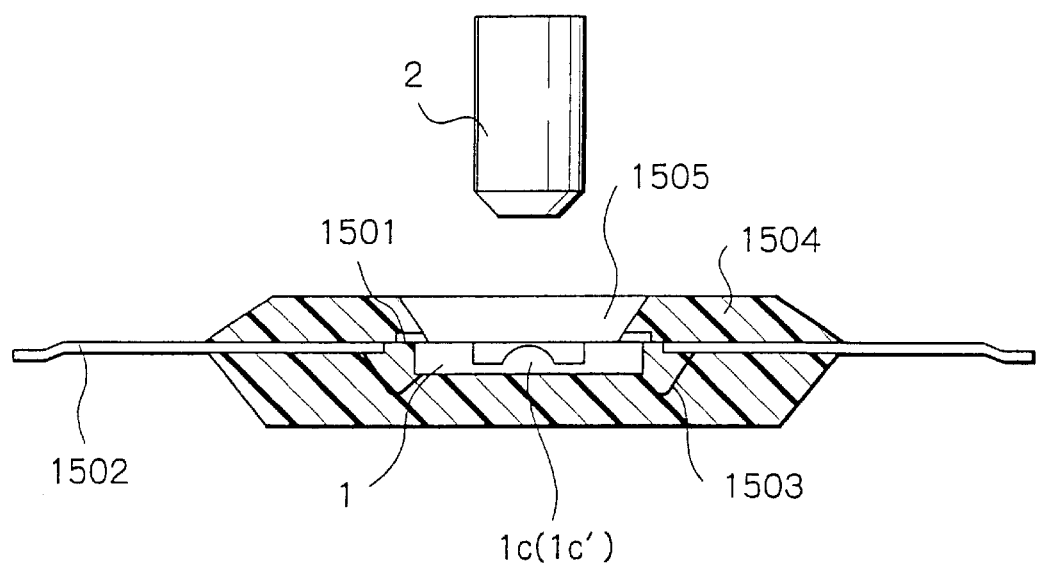
FIG. 15 is a diagram illustrating a first detailed example of the semiconductor device evaluating apparatus based on the apparatus of FIG. 4 or FIG. 5.

In FIG. 15, the semiconductor device 1 having the hemispherical solid immersion lens 1c or 1c' is mounted on an island 1501 connected to lead terminals 1502. Also, pads (not shown) of the semiconductor device 1 are connected by bonding wires 1503 to the lead terminals 1502. The semiconductor device 1, the island 1501, the lead terminal 1502 and the bonding wires 1503 are sealed by a thermosetting resin mold 1504. In this case, a part of the island 1501 and the thermosetting resin mold 1504 is perforated to observe the hemispherical immersion lens 1c or 1c'.

In FIG. 15, the semiconductor device 1 is mounted on a tester having an objective lens 2. Therefore, when electrical signals are supplied to the lead terminals 1502, infrared rays are generated from the hemispherical solid immersion lens 1c or 1c' to the objective lens 2, to carry out a back surface analysis.

Figure 16:
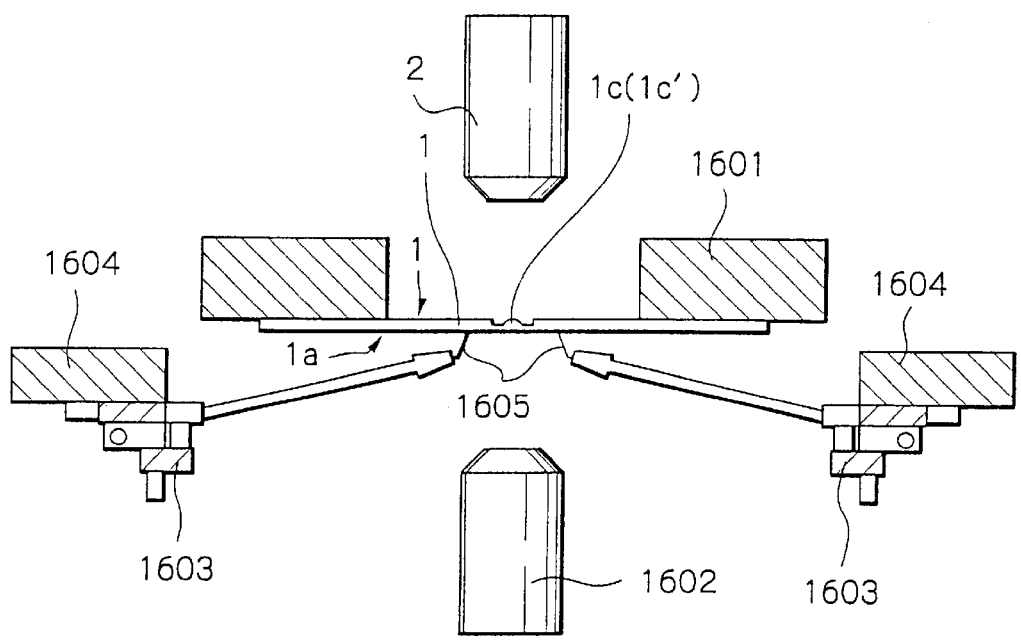
FIG. 16 is a diagram illustrating a second detailed example of the semiconductor device evaluating apparatus based on the apparatus of FIG. 4 or FIG. 5.

In FIG. 16, the semiconductor device 1 having the hemispherical solid immersion lens 1c or 1c' is of a wafer type and is mounted on a wafer stage 1601. In this case, the back surface 1b of the semiconductor device 1 is vacuum-sucked to the wafer stage 1601 and opposes an evaluating objective lens 2. On the other hand, the front surface 1a of the semiconductor device 1 opposes a monitoring objective lens 1602. Therefore, while the front surface 1a of the semiconductor device 1 is observed by the monitoring objective lens 1602, to operate manipulators 1603 fixed to a platen 1604, probes 1605 are placed on the pads of the semiconductor device 1.

In FIG. 16, when electrical signals are supplied via the probes 1605 to the semiconductor device 1, infrared rays are generated from the hemispherical solid immersion lens 1c or 1c' to the objective lens 2, to carry out a back surface analysis.

As explained hereinabove, according to the present invention, since a solid immersion lens is formed in a body with a semiconductor device, there is no gap between the solid immersion lens and the semiconductor device, so that a higher resolution can be obtained.

What is claimed is:

1. A method for manufacturing a semiconductor device, comprising the steps of:

forming a recess in or on a back surface of said semiconductor device;

fitting a grinding tool having a hemicircularly-cross-sectional groove into said recess; and rotating said grinding tool so that a hemispherical solid immersion lens is formed at the back surface of said semiconductor device.

2. The method as set forth in claim 1, wherein said recess is circular and said grinding tool is cylindrical.

3. The method as set forth in claim 1, wherein said recess forming step comprises the steps of:

moving said semiconductor device in relation to a circular guide, so that a specific location of said semiconductor device conform to an opening of said circular guide;

fitting said grinding tool into said circular guide; and rotating said grinding tool so that said recess is formed in the back surface of said semiconductor device.

4. The method as set forth in claim 3, wherein said recess forming step forms said recess by using an alignment unit having said circular guide.

5. The method as set forth in claim 1, further comprising the steps of:

coating a photoresist layer on the back surface of said semiconductor device;

carrying out a photolithography process upon said photoresist layer by a double-side alignment exposure unit to form a photoresist pattern having a hole corresponding to said recess;

etching said semiconductor device using said photoresist pattern as a mask; and removing said photoresist pattern after said semiconductor device is etched, so that said recess is formed in said semiconductor device.

6. The apparatus as set forth in claim 5, wherein said etching step uses an isotropic etching process.

7. The method as set forth in claim 1, further comprising the steps of:

placing said grinding tool on a glass substrate;

rotating said grinding tool so that said recess is formed in said glass substrate; and adhering said glass substrate with said recess to the back surface of said semiconductor device.

8. The method as set forth in claim 7, wherein said rotating step is carried out so that an island is left at a center of said recess of said glass substrate.

* * * * *